(12) United States Patent
Slaughter et al.

(10) Patent No.: US 7,965,543 B2
(45) Date of Patent: Jun. 21, 2011

(54) METHOD FOR REDUCING CURRENT DENSITY IN A MAGNETOELECTRONIC DEVICE

(75) Inventors: Jon M. Slaughter, Tempe, AZ (US); Nicholas D. Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 168 days.

(21) Appl. No.: 12/433,670

(22) Filed: Apr. 30, 2009

(65) Prior Publication Data

US 2010/0277971 A1 Nov. 4, 2010

(51) Int. Cl.
 *G11C 11/00* (2006.01)
(52) U.S. Cl. ........................ 365/158; 365/171; 365/173
(58) Field of Classification Search .................. 365/158, 365/171, 173
 See application file for complete search history.

(56) References Cited

U.S. PATENT DOCUMENTS

| | | | |
|---|---|---|---|
| 7,095,646 B2 * | 8/2006 | Slaughter et al. | 365/158 |
| 7,112,354 B2 * | 9/2006 | Hannah et al. | 365/158 |
| 7,149,106 B2 * | 12/2006 | Mancoff et al. | 365/158 |
| 7,230,844 B2 * | 6/2007 | Deak | 365/171 |
| 7,266,012 B2 * | 9/2007 | Saito et al. | 365/158 |
| 7,382,664 B2 * | 6/2008 | Le Phan | 365/158 |
| 7,502,253 B2 * | 3/2009 | Rizzo | 365/158 |
| 7,558,103 B2 * | 7/2009 | Nakamura et al. | 365/171 |
| 7,577,020 B2 * | 8/2009 | Chung et al. | 365/158 |
| 7,605,437 B2 * | 10/2009 | Mancoff et al. | 365/158 |
| 7,715,228 B2 * | 5/2010 | Deak | 365/158 |
| 7,738,278 B2 * | 6/2010 | Kim et al. | 365/158 |
| 7,751,223 B2 * | 7/2010 | Kim et al. | 365/158 |
| 7,800,938 B2 * | 9/2010 | Rivkin et al. | 365/158 |
| 7,826,256 B2 * | 11/2010 | Zheng et al. | 365/158 |
| 7,860,351 B2 * | 12/2010 | Yagami | 365/158 |
| 2005/0153063 A1 | 7/2005 | Janesky et al. | |
| 2006/0180839 A1 | 8/2006 | Fukumoto et al. | |
| 2006/0262594 A1 | 11/2006 | Fukumoto | |
| 2007/0047294 A1 | 3/2007 | Panchula | |
| 2008/0043517 A1 | 2/2008 | Ikarashi | |
| 2008/0151614 A1 | 6/2008 | Guo | |
| 2009/0050991 A1 | 2/2009 | Nagai et al. | |

OTHER PUBLICATIONS

Devolder, T., et al. "Magnetization Switching by Spin Torque Using Subnanosecond Current Pulses Assisted by Hard Axis Magnetic Fields," Applied Physics Letters vol. 88 No. 15. pp. 152502-1-152502-3. 2006.

International Search Report for PCT/US10/31379 mailed Jun. 10, 2010.

(Continued)

*Primary Examiner* — Trong Phan
(74) *Attorney, Agent, or Firm* — Ingrassia Fisher & Lorenz, P.C.

(57) ABSTRACT

A method for reducing spin-torque current density needed to switch a magnetoelectronic device (200, 300, 400), includes applying (602) a voltage bias having a predetermined polarity to the magnetoelectronic device (200, 300, 400) that creates a spin-polarized current with spin torque transfer to a synthetic antiferromagnet free layer (206), applying (604) a magnetic field having a predetermined direction to the magnetoelectronic device (200, 300, 400), removing (606) the applied magnetic field; and removing (608) the voltage bias subsequent to removing (606) the applied magnetic field, wherein the polarity of the voltage bias and the direction of the magnetic field leave the synthetic antiferromagnet free layer (206) in a predetermined magnetic state after the voltage bias is removed.

13 Claims, 5 Drawing Sheets

OTHER PUBLICATIONS

Jeong, W.C., et al. "Highly Scalable MRAM Using Field Assisted Current Induced Switching," Symposium on VLSI Technology Digest of Technical Papers, pp. 184-185; 2005.

Li, Z., et al. "Perpendicular Spin Torques in Magnetic Tunnel Junctions," The American Physical Society: Physical Review Letters. pp. 246601-1 through 246602-4. Jun. 2008.

* cited by examiner

*Fig. 1*

-PRIOR ART-

-PRIOR ART-

METHOD FOR REDUCING CURRENT DENSITY IN A MAGNETOELECTRONIC DEVICE

FIELD OF THE INVENTION

The present invention generally relates to magnetoelectronic information devices and more particularly to devices such as magnetoresistive random access memory elements having a reduced switching current density without a reduced energy barrier to reversal of the magnetic state.

BACKGROUND OF THE INVENTION

Magnetoelectronic devices, spin electronic devices, and spintronic devices are synonymous terms for devices that make use of effects predominantly caused by electron spin. Magnetoelectronics are used in numerous information devices, and provides non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically, a magnetoelectronic information device, such as an MRAM, includes an array of memory elements. Each memory element typically has a structure that includes multiple magnetic layers separated by various non-magnetic layers. Information is stored as directions of magnetization vectors in the magnetic layers. Magnetic vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoelectronics information device, such as an MRAM device, to provide information stored in the magnetic memory element.

Figure 1:
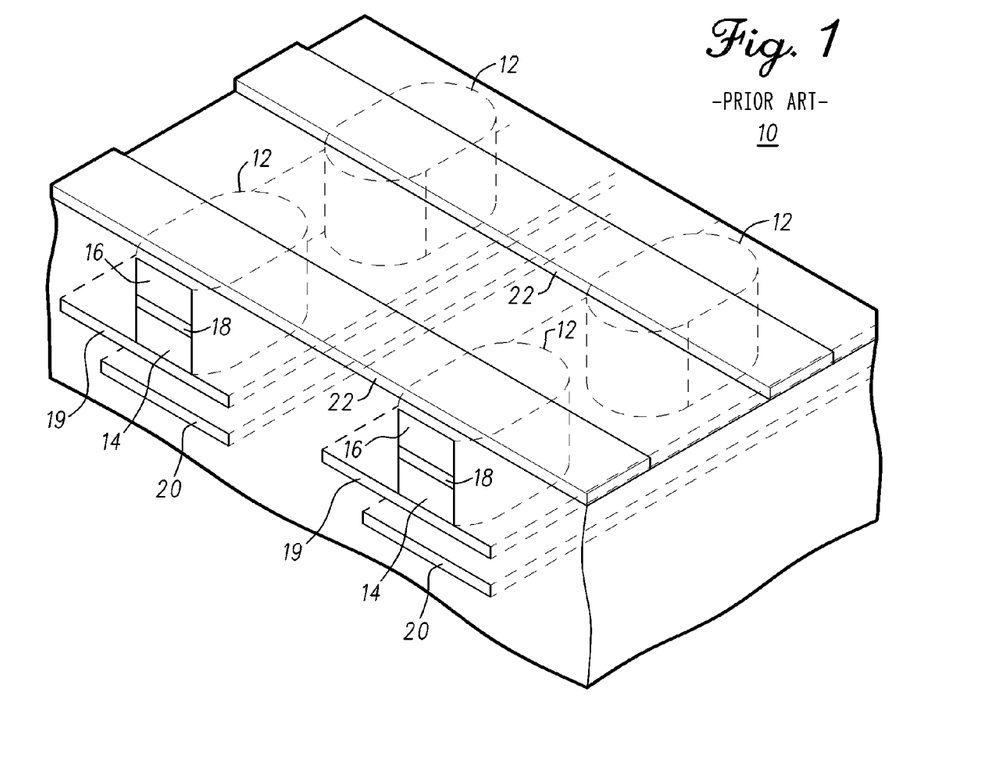
FIG. 1 is a conventional MRAM memory element array.

MRAM technology uses magnetic components to achieve non-volatility, high-speed operation, and excellent read/write endurance. FIG. 1 illustrates a conventional memory element array 10 having one or more memory elements 12. An example of one type of magnetic memory element, a magnetic tunnel junction (MTJ) element, comprises a fixed ferromagnetic layer 14 that has a magnetization direction fixed with respect to an external magnetic field and a free ferromagnetic layer 16 that has a magnetization direction that is free to rotate with the external magnetic field. The fixed layer and free layer are separated by an insulating tunnel barrier layer 18. The resistance of memory element 12 relies upon the phenomenon of spin-polarized electron tunneling through the tunnel barrier layer between the free and fixed ferromagnetic layers. The tunneling phenomenon is electron spin dependent, making the electrical response of the MTJ element a function of the relative magnetization orientations and spin polarization of the conduction electrons between the free and fixed ferromagnetic layer.

The memory element array 10 includes conductors 20, also referred to as digit lines 20, extending along rows of memory elements 12, conductors 22, also referred to as word or bit lines 22, extending along columns of the memory elements 12, and conductor 19, also referred to as an electrode 19, electrically contacting the fixed layer 14. While the electrodes 19 contact the fixed ferromagnetic layer 14, the digit line 20 is spaced from the electrodes 19 by, for example, a dielectric material (not shown). A memory element 12 is located at a cross point of a digit line 20 and a bit line 22. The magnetization direction of the free layer 16 of a memory element 12 is switched by supplying currents to electrode 19 and bit line 22. The currents create magnetic fields that switch the magnetization orientation of the selected memory element from parallel to anti-parallel, or vice versa. To sense the resistance of element 12 during the read operation, a current is passed from a transistor in the substrate (not shown) through a conductive via (not shown) connected to electrode 19.

Figure 2:
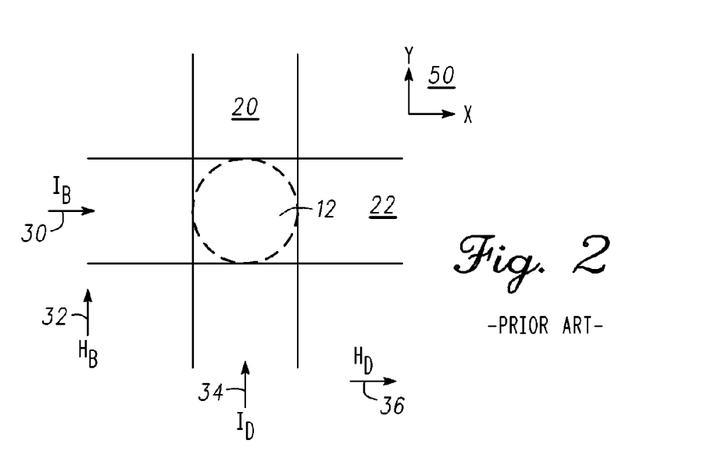
FIG. 2 illustrates magnetic fields generated at a memory element of a conventional MRAM memory element array.

FIG. 2 illustrates the fields generated by a conventional linear digit line 20 and bit line 22. To simplify the description of MRAM device 10, all directions will be referenced to an x- and y-coordinate system 50 as shown. A bit current $I_B$ 30 is defined as being positive if flowing in a positive x-direction and a digit current $I_D$ 34 is defined as being positive if flowing in a positive y-direction. A positive bit current $I_B$ 30 passing through bit line 22 results in a circumferential bit magnetic field, $H_B$ 32, and a positive digit current ID 34 will induce a circumferential digit magnetic field $H_D$ 36. The magnetic fields $H_B$ 32 and $H_D$ 36 combine to switch the magnetic orientation of the memory element 12.

The traditional MRAM switching technique, using magnetic fields generated by current-carrying lines adjacent to the memory element, depicted in FIG. 2, has some practical limitations, particularly when the design calls for scaling the bit cell to smaller dimensions. For example, since this technique requires two sets of magnetic field write lines, the array of MRAM cells is susceptible to bit disturbs, i.e., neighboring cells may be unintentionally altered in response to the write current directed to a given cell. In some embodiments of field-switched MRAM, the elements not located at the cross point of the two active write lines experience only one of $H_D$ 36 and $H_B$ 32, known as half-selected elements, have a reduced energy barrier to reversal and therefore have a significant probability of unintentional reversal. Furthermore, decreasing the physical size of the MRAM elements results in lower magnetic stability against magnetization switching due to thermal fluctuations, because the energy barrier to thermal reversal decreases with decreasing free layer volume. The stability of the bit can be enhanced by utilizing a magnetic material for the free layer with a large magnetic anisotropy and therefore a large switching field, but then the currents required to generate a magnetic field strong enough to switch the bit can be impractical in real applications.

Figure 3:
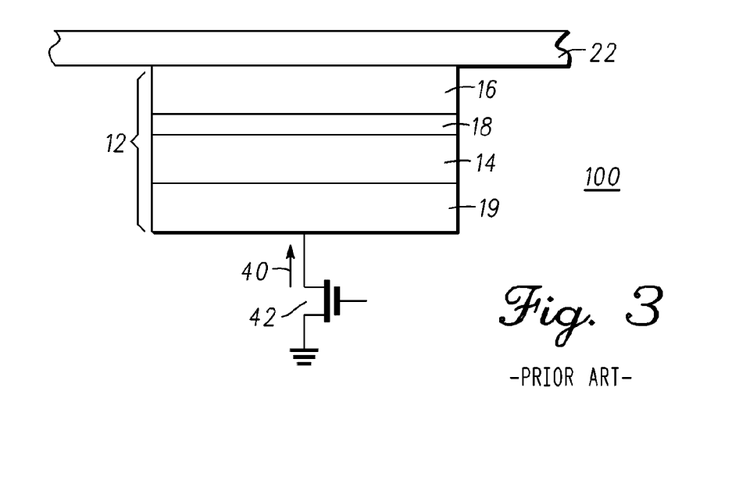
FIG. 3 is a conventional spin torque transfer memory element.

In spin-torque MRAM (ST-MRAM) devices, such as the structure 100 shown in FIG. 3, the bits are written by forcing a current 40 directly through the stack of materials that make up the magnetic tunnel junction 12, e.g., via current controlled via isolation transistor 42. Generally speaking, the write current 40 which is spin polarized by passing through one ferromagnetic layer (14 or 16), exerts a spin torque on the subsequent layer. This torque can be used to switch the magnetization of free magnet 16 between two stable states by changing the write current polarity.

The spin-torque effect is known to those skilled in the art. Briefly, a current becomes spin-polarized after the electrons pass through the first magnetic layer in a magnet/non-magnet/magnet trilayer structure, where the first magnetic layer is substantially fixed in its magnetic orientation by any one of a number of methods known in the art. The spin-polarized electrons cross the nonmagnetic spacer and then, through conservation of spin angular momentum, exert a spin torque on the second magnetic layer, which switches the magnetic orientation of the second layer to be parallel to the magnetic orientation of the first layer. If a current of the opposite polarity is applied, the electrons instead pass first through the second magnetic layer. After crossing the nonmagnetic spacer, a spin torque is applied to the first magnetic layer. However, since its magnetization is fixed, the first magnetic layer does not switch. Simultaneously, a fraction of the electrons will then reflect off the first magnetic layer and travel back across the nonmagnetic spacer before interacting with the second magnetic layer. In this case, the spin torque acts so as to switch the magnetic orientation of the second layer to be anti-parallel to the magnetic orientation of the first layer. Spin-torque switching occurs only when the current 40 exceeds the critical current $I_C$ of the element. The spin-torque switching current used by the circuit is chosen to be somewhat above the average $I_C$ of the memory elements so that all elements will switch reliably when the switching current is applied.

However, these known ST-MRAM cells require a high current density to switch the direction of the free layer. While an easy axis assist field could be used to reduce the switching current density, this field also reduces the energy barrier of the half-selected elements in an array for magnetization reversal due to thermal fluctuations.

Accordingly, it is desirable to provide a magnetoelectronic information device and switching method that reduces the required spin-torque current density and cell size without unwanted reversal of non-selected elements in the array. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for reducing spin-torque switching current density in a magnetoelectronic device, includes applying a voltage bias having a predetermined polarity to the magnetoelectronic device that creates a spin-polarized current with spin torque transfer to a synthetic antiferromagnet free layer, applying a magnetic field having a predetermined direction to the magnetoelectronic device, removing the applied magnetic field; and removing the voltage bias subsequent to removing the applied magnetic field, wherein the polarity of the voltage bias and the direction of the magnetic field leave the synthetic antiferromagnet free layer in a predetermined magnetic state after the voltage bias is removed.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The embodiments described herein include new MRAM switching methods that utilize aspects of field switching and aspects of spin torque switching wherein a field assist can be used to reduce the spin torque switching current without reducing the energy barrier for half-selected elements. The bit comprises a balanced synthetic antiferromagnet (SAF) free layer as used in toggle MRAM, for example, including at least two ferromagnetic layers of approximately equal magnetic moment that are antiferromagnetically coupled through a coupling spacer layer. A current is applied through the element to enable a spin torque to act on the free layer. In an exemplary embodiment, current is applied through conductive lines positioned on both sides of the SAF free layer to create a magnetic field that acts on the free layer. This magnetic field reduces the ST switching current density; however, the half-selected elements remain thermally stable since the energy barrier is reduced less than previously known methods.

Figure 4:
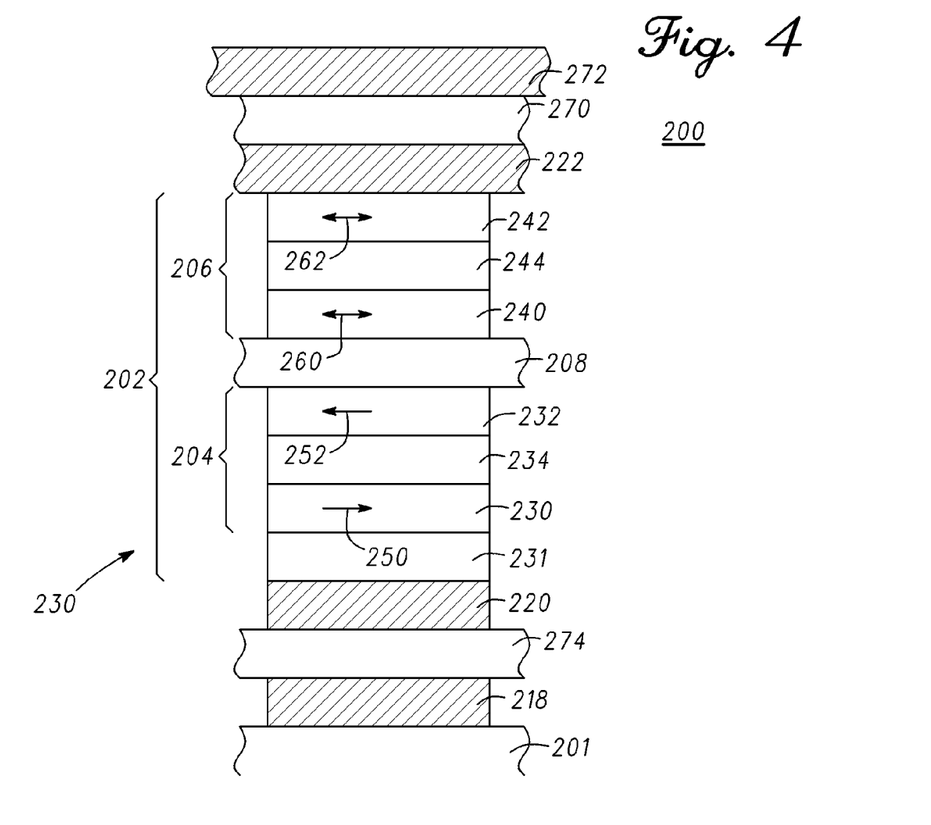
FIG. 4 is a cross-sectional view of a memory element in accordance with a first exemplary embodiment.

Turning now to FIG. 4, in accordance with a first exemplary embodiment of the present invention, a simplified sectional view of an MRAM array 200 comprises a scalable magnetoresistive memory element 202 formed on a substrate 201. In this illustration, only a single magnetoresistive memory element 202 is shown for simplicity in describing the embodiments of the present invention, but it will be understood that MRAM array 200 may include a number of magnetoresistive memory elements 202.

Conductive bit line 272 is above and conductive digit line 218 is below magnetoresistive memory element 202. Bit line 272 and digit line 218 include conductive material such that a current can be passed therethrough, for example, one of the elements Al, Cu, Au, Ag, Ta or their combinations. Bit line 272 and digit line 218 are orthogonal to one another. Current is passed through the bit line and/or digit line to generate magnetic fields acting on magnetoresistive memory element 202. In one exemplary embodiment, bit line 272 also makes electrical contact to the top electrode of magnetoresistive memory element 202, so that conductive line 222 (described below) is not needed.

Magnetoresistive memory element 202 is sandwiched between electrodes 220, 222. Electrodes 220, 222 include conductive material such that a current can be passed therethrough, for example, one of the elements Al, Cu, Au, Ag, Ta or their combinations. In this illustration, electrode 222 is positioned on top of magnetoresistive memory element 202 and electrode 220 is positioned on the bottom of magnetoresistive memory element 202.

Magnetoresistive memory element 202 comprises a first magnetic region 204, a second magnetic region 206, and a tunnel barrier 208 disposed between first magnetic region 204 and second magnetic region 206. In one embodiment of the invention, magnetic region 204 includes a SAF structure having a coupling spacer layer 234 sandwiched between two ferromagnetic portions 230 and 232. The magnetic moments of ferromagnetic portions 230 and 232 are approximately of equal magnitude and in opposite directions, by definition for a SAF structure. Ferromagnetic portion 230 is on top of antiferromagnetic pinning layer 231, which holds the magnetization direction of layer 230 in a fixed direction. Antiferromagnetic pinning layer 231 may comprised materials such as PtMn, IrMn, FeMn, PdMn, or combinations thereof. However, it will be appreciated by those skilled in the art that first magnetic region 204 may have any structure suitable for providing a fixed magnetic portion in contact with the tunnel barrier to provide a fixed magnetic reference direction. Further, second magnetic region 206 includes an SAF structure, which has a coupling spacer layer 244 disposed between two ferromagnetic portions 240 and 242.

Ferromagnetic portions 230, 232, 240, and 242 may be formed from any suitable magnetic material, such as at least one of the elements Ni, Fe, Co, or their alloys that may also include nonmagnetic materials such as B, Cu, Mo, Ta, Ti, V, or from so-called half-metallic ferromagnets such as NiMnSb, PtMnSb, $Fe_3O_4$, or $CrO_2$. Spacer layers 234 and 244 are formed from any suitable nonmagnetic material, for example, at least one of the elements Ru, Os, Re, Cr, Rh, Cu, or their combinations. The tunnel barrier 208 may be insulator materials such as AlOx, MgOx, RuOx, HfOx, ZrOx, TiOx, or the nitrides and oxidinitrides of these elements. It is further understood that layer 208 could be a conductive nonmagnetic spacer layer such that the device exhibits the giant magnetoresistance effect (GMR) or other types of spacer layers that exhibit related magnetoresistance effects rather than the tunneling magnetoresistance effect (TMR); however, the device otherwise operates in the same manner as if an insulating tunnel barrier material were used for layer 208. Examples of conductive nonmagnetic spacers include Cu and Cr. Other related spacers include those which effectively increase the polarization of the tunneling current due to their special electrical properties. The magnetoresistance is determined by the relative orientation of magnetic moments 260 and 252.

Ferromagnetic portions 230 and 232 each have a magnetic moment vector 250 and 252, respectively, that are usually held anti-parallel by the coupling spacer layer 234. Likewise, ferromagnetic portions 240 and 242 each have a magnetic moment vector 260 and 262, respectively, that are usually held anti-parallel by the coupling spacer layer 244. As discussed above, antiferromagnetic pinning layer 231 holds magnetic moment vector 250 in a fixed direction and magnetic moment vector 252 in the opposite direction as a consequence of antiparallel coupling layer 234. In the absence of a magnetic field, the direction of magnetic vectors 260 and 262 are parallel to the pinning direction set by layer 231. The direction of magnetic vectors 260 and 262 is determined by the anisotropy created by the shape of free layer 206 and by the intrinsic anisotropy of the magnetic materials used in the free layer 206. In one embodiment, the shape of free layer 206 has an aspect ratio greater than one, wherein the long axis (easy axis) is parallel to the pinning direction of layer 231.

In one embodiment of the invention, the free layer easy axis is oriented at an angle in the range of about 30 degrees to about 60 degrees from digit line 218 or bit line 272. In a preferred embodiment of the invention, the free layer easy axis is oriented at an angle of about 45 degrees from digit line 218 and bit line 272. Further, magnetic region 206 is a free ferromagnetic region, meaning that magnetic moment vectors 260 and 262 are free to rotate in the presence of a spin torque. Magnetic region 204 is a pinned ferromagnetic region, meaning that magnetic layers 250 and 252 are not free to rotate in the presence of a spin torque and is used as the reference layer.

A dielectric layer 270 is disposed between the top electrode 222 and an bit line 272. Another dielectric layer 274 is disposed between electrode 220 and digit line 218.

During fabrication of MRAM array 200, each succeeding layer is deposited or otherwise formed in sequence and each memory element 202 may be defined by selective deposition, photolithography processing, etching, etc. using any of the techniques known in the semiconductor industry. A magnetic field is typically provided during deposition of at least the ferromagnetic portions 240 and 242, and/or during a subsequent anneal at elevated temperature, to set a preferred intrinsic anisotropy direction (intrinsic anisotropy). As discussed above, this intrinsic anisotropy is parallel to the shape anisotropy and defines the easy axis of the bit, i.e. the direction of magnetic vectors 260 and 262 in the absence of magnetic field.

Figure 5:
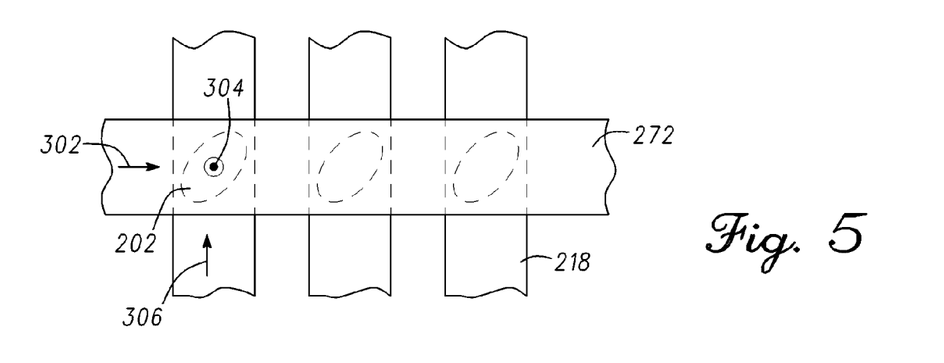
FIG. 5 is a top view of the first exemplary embodiment of FIG. 4.
Figure 6:
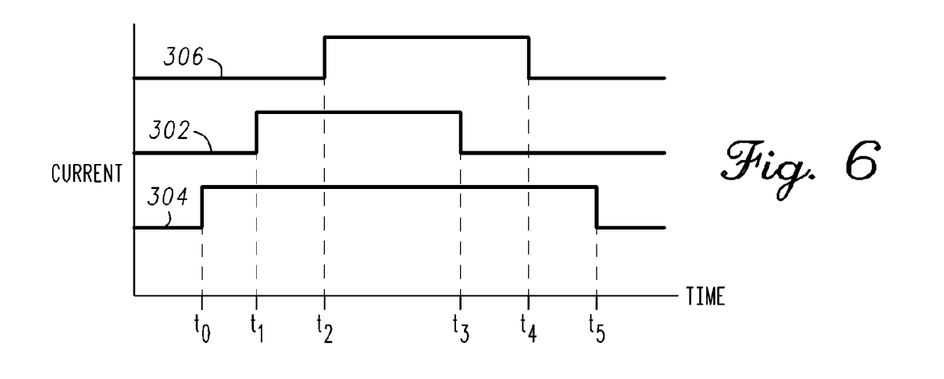
FIG. 6 is a graph of the timing pulses of current and field pulses applied to the first exemplary embodiment of FIGS. 4 and 5.

FIG. 5 (a top view of the MRAM array of FIG. 4) and FIG. 6 illustrates the relationship of the pulsing of currents 302 and 306 in the lines 272 and 218 of the first embodiment that generates a magnetic field acting on the magnetoresistive memory element 202, and a current 304 applied through the magnetoresistive memory element 202 to generate a spin torque. At a time $t_0$, the current 304 is applied to generate the spin torque. At time $t_1 > t_0$, a current 302 is applied in bit line 272 to generate a first magnetic field. At a time $t_2 > t_1$, a current 306 is applied in digit line 218 to generate a second magnetic field. The polarity of digit line current is chosen so that the magnetic field projection on the bit easy axis is in the same direction as the bit line magnetic field projection on the bit easy axis. At time $t_3 > t_2$, current 302 is turned off. At time $t_4 > t_3$, current 306 is turned off. At a time $t_5 > t_4$, the current 304 is turned off. The pulse sequence for currents 302 and 306 is the same as that used for the toggle pulse sequence described in U.S. Pat. No. 6,545,906 assigned to the Assignee of this invention.

By applying the toggle field sequence along with a spin torque current to a SAF free layer, the spin torque switching current can be reduced. However, since the free layer is a SAF and the magnetic fields are applied at 45 degrees to the easy axis of the free layers, the ½ selected bits are much less susceptible to being disturbed, as is well known in the prior art for a toggle switching method.

Figure 7:
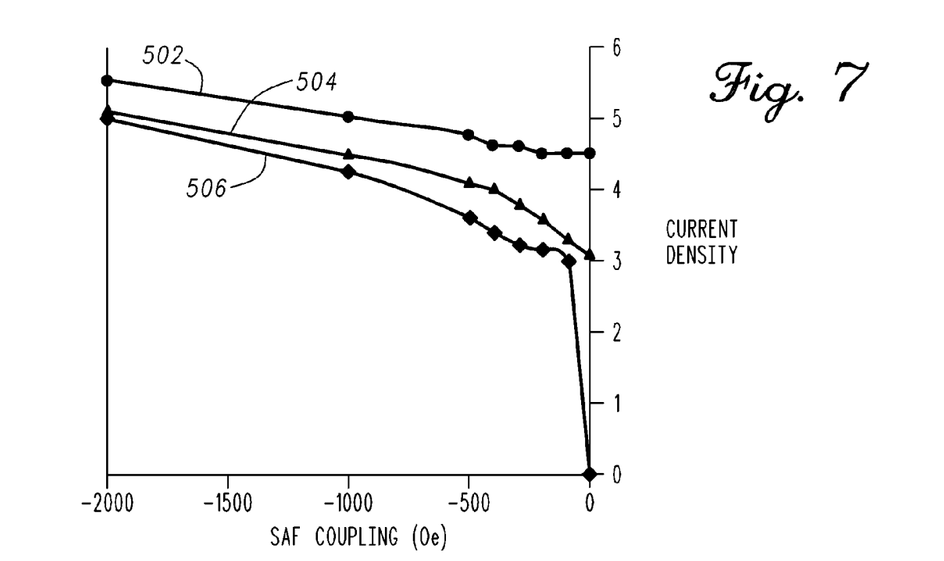
FIG. 7 is a graph of the current density versus SAF coupling of the first exemplary embodiment of FIGS. 4 and 5.

Reducing the spin torque Isw for a SAF free layer by applying a toggle field sequence was demonstrated using a single domain magnetodynamical simulation. The simulation used the Landau-Lifshitz-Gilbert equations with the Slonczewski torque term and a SAF free layer of size 80 nm×160 nm×3 nm, with a saturation magnetization Ms=800 emu/cm$^3$, gilbert damping constant=0.015, and spin polarization=0.4. The simulation included the antiferromagnetic coupling between the layers of the SAF as well as magnetostatic coupling. The shape anisotropy was taken to $H_k$=150 Oe for a single layer of the SAF. The spin torque current pulse duration was 40 ns, and the toggle field pulse durations were 15 ns each with 5 ns delay between the first and second pulse. The simulation results are shown in FIG. 7, where Isw is plotted vs. SAF coupling strength for different magnitudes of applied field 502, 504, 506 (H=zero, 60 Oe, and 90 Oe, respectively). The field magnitude is for one of the field pulses only. As shown, the spin torque switching current is smaller when the toggle fields of H=60 Oe or H=90 Oe are applied, compared to the case when no field is applied. Note that the switching current goes to zero for H=90 Oe. In this case, the applied field exceeds the toggle field of the SAF.

Figure 8:
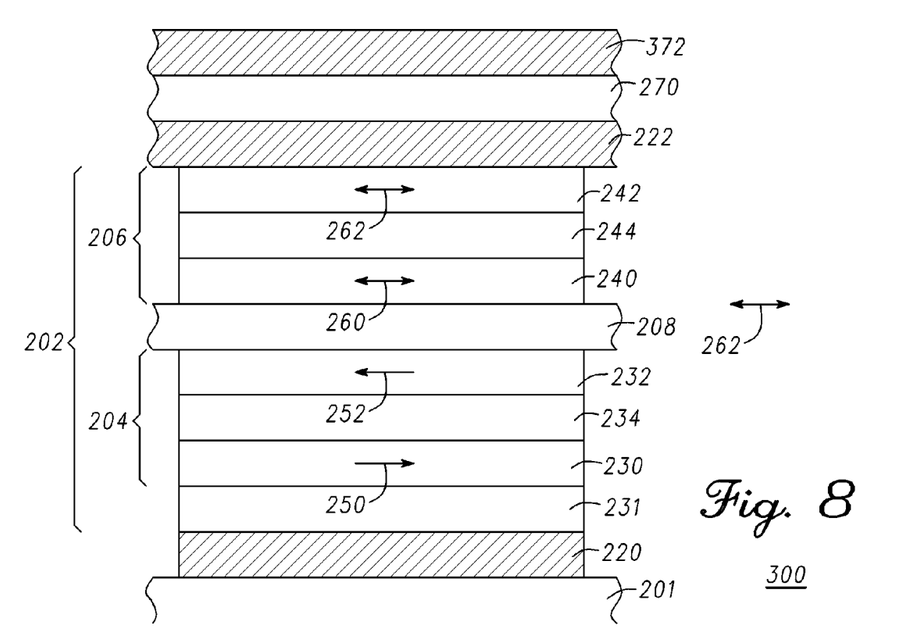
FIG. 8 is a cross-sectional view of a memory element in accordance with a second exemplary embodiment.

Turning now to FIG. 8, in accordance with a second exemplary embodiment of the present invention, a simplified sectional view of an MRAM array 300 comprises a scalable magnetoresistive memory element 202 formed on a substrate 201. In this illustration, only a single magnetoresistive memory element 202 is shown for simplicity in describing the embodiments of the present invention, but it will be understood that MRAM array 200 may consist of a number of magnetoresistive memory elements 202.

Conductive bit line 372 is above the magnetoresistive memory element 202. Bit line 372 is oriented so that it generates a magnetic field approximately parallel to the magnetic easy axis of the free layer 206, or with a substantial component along the easy axis, when a current $I_B$ passes through it. The direction of the current can be reversed to produce a field of opposite direction, approximately parallel or antiparallel to the magnetization of the fixed layer 204.

Magnetoresistive memory element 202 is sandwiched between electrodes 220, 222. Electrodes 220, 222 include conductive material such that a current can be passed therethrough, for example, one of the elements Al, Cu, Au, Ag, Ta or their combinations. In this illustration, electrode 222 is positioned on top of magnetoresistive memory element 202 and electrode 220 is positioned on the bottom of magnetoresistive memory element 202.

Magnetoresistive memory element 202 comprises a first magnetic region 204, a second magnetic region 206, and a tunnel barrier 208 disposed between first magnetic region 204 and second magnetic region 206. In one embodiment of the invention, magnetic region 204 includes a synthetic antiferromagnet (SAF) structure having a coupling spacer layer 234 sandwiched between two ferromagnetic portions 230 and 232. The magnetic moments of ferromagnetic portions 230 and 232 are approximately of equal magnitude and in opposite directions, by definition for a SAF structure. Ferromagnetic portion 230 is on top of antiferromagnetic pinning layer 231, which holds the magnetization direction of layer 230 in a fixed direction. Antiferromagnetic pinning layer 231 may be comprised of materials such as PtMn, IrMn, FeMn, PdMn, or combinations thereof. However, it will be appreciated by those skilled in the art that first magnetic region 204 may have any structure suitable for providing a fixed magnetic portion in contact with the tunnel barrier to provide a fixed magnetic reference direction. Further, second magnetic region 206 comprises an SAF structure, which has a coupling spacer layer 244 disposed between two ferromagnetic portions 240 and 242.

Ferromagnetic portions 230 and 232 each have a magnetic moment vector 250 and 252, respectively, that are usually held anti-parallel by coupling spacer layer 234. Likewise, ferromagnetic portions 240 and 242 each have a magnetic moment vector 260 and 262, respectively, that are usually held anti-parallel by the coupling spacer layer 244. As discussed above, antiferromagnetic pinning layer 231 holds magnetic moment vector 250 in a fixed direction and magnetic moment vector 252 in the opposite direction as a consequence of antiparallel coupling layer 234. In the absence of magnetic field, the direction of magnetic vectors 260 and 262 are parallel to the pinning direction set by layer 231. The direction of magnetic vectors 260 and 262 is determined by the anisotropy created by the shape of free layer 206 and by the intrinsic anisotropy of the magnetic materials used in the free layer 206. In one embodiment, the shape free layer 206 has an aspect ratio greater than 1 whose long axis (easy axis) is parallel to the pinning direction of layer 231.

Magnetic region 206 is a free ferromagnetic region, meaning that magnetic moment vectors 260 and 262 are free to rotate in the presence of a spin torque. Magnetic region 204 is a pinned ferromagnetic region, meaning that magnetic layers 250 and 252 are not free to rotate in the presence of a spin torque and is used as the reference layer.

A dielectric layer 270 is disposed between the bit line electrode 222 and an electrode 372.

During fabrication of MRAM array 200, each succeeding layer is deposited or otherwise formed in sequence and each memory element 202 may be defined by selective deposition, photolithography processing, etching, etc. using any of the techniques known in the semiconductor industry. A magnetic field is typically provided during deposition of at least the ferromagnetic portions 240 and 242, and/or during a subsequent anneal at elevated temperature, to set a preferred intrinsic anisotropy direction (intrinsic anisotropy). As discussed above, this intrinsic anisotropy is parallel to the shape anisotropy and defines the easy axis of the bit, i.e. the direction of magnetic vectors 260 and 262 in the absence of magnetic field.

Figure 9:
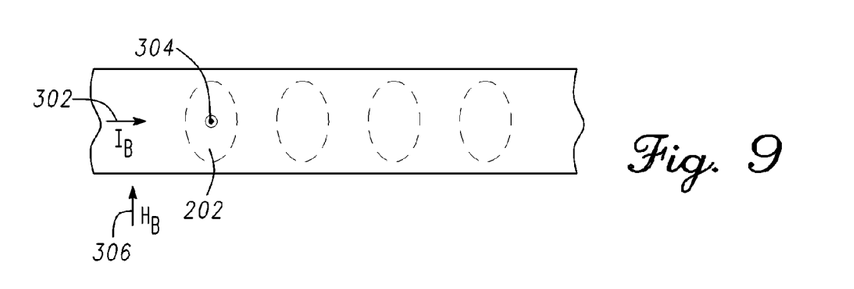
FIG. 9 is a top view of the second exemplary embodiment of FIG. 8.
Figure 10:
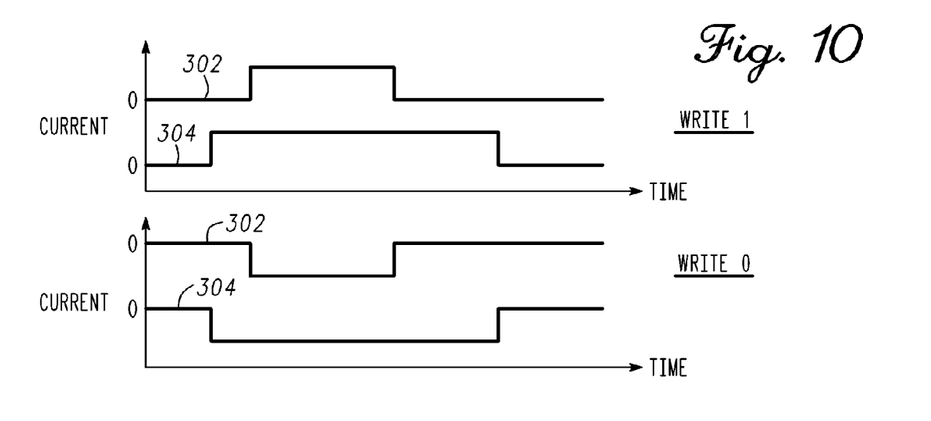
FIG. 10 is a graph of the timing pulses of current and field pulses applied to the second exemplary embodiment of FIGS. 8 and 9.

FIG. 9 (a top view of the MRAM array of FIG. 8) and FIG. 10 illustrate the relationship of the pulsing of current 302 in the bit line 372 that generates a magnetic field 306 acting on the magnetoresistive memory element 202, and a current 304 applied through the magnetoresistive memory element 202 to generate a spin torque. The preferred angle between the magnetic field 306 and the easy axis of the free layer is 45 degrees or less and the most preferred is zero, meaning the field lies along the easy axis. At a time $t_0$, the current 304 is applied to generate the spin torque. At time $t_1$, a current 302 is applied in bit line 372 to generate a magnetic field along the easy axis of the free layer 206, either parallel or antiparallel to the moment of the fixed layer 252. At time $t_2$, where $t_2 > t_0$ and $t_2 > t_1$, current 302 is turned off. At a time $t_3 > t_2$, the current 304 is turned off. When the direction of the magnetic field created by bit line current 302 opposes the moment of the sense layer 260 and the direction of the spin torque current 304 favors switching of 260, then the free layer will complete a switching operation. The polarity of the currents is chosen, for example current 302 is positive when programming a "1" (WRITE 1) and negative when programming a "0" (WRITE 0), so that the spin torque combined with the effect of the magnetic field causes the moment of the sense layer 260 to rotate more than 90 degrees from its initial position toward the desired state. If the moment of the sense layer 260 is already in the desired direction before the pulses are applied, it will not change reverse direction upon application of the pulses.

By applying the magnetic field in the correct direction along with a spin torque current to a SAF free layer, the spin torque switching current can be reduced. However, the magnitude of the field is chosen to be below the flop field $H_{flop}$ which would cause the moments of the SAF to rotate and cant to equivalent angles with respect to the applied field. It is known in the art that a field applied along the easy axis of the SAF with a magnitude less than $H_{flop}$ does not cause rotation of the moments and that a field over the threshold defined by $H_{flop}$ will cause the spin flop transition described above. Since the free layer is a SAF and the magnetic field is chosen to be less than $H_{flop}$, the ½ selected bits are not susceptible to being disturbed. When the spin torque current is applied to a bit in the presence of the field, the torque on layer 240 breaks the symmetry and assists in rotating the moment to the desired position.

In a third embodiment, the magnetoresistive element of FIG. 8 is oriented so that the magnetic field created by the current flowing in bitline 372 is perpendicular to the magnetic easy axis. In this embodiment, the magnitude of the current pulse 302 in FIG. 10 is chosen to create a field $H_B$ that is similar in magnitude, or greater than the field needed to saturate the SAF free layer along its hard axis $H_{sat}$. In saturation, the moments 260, 262 of the free layer 206 lie approximately perpendicular to the easy axis and parallel to each other. When the field $H_B$ is removed at time $t_2$, the moments of the SAF free layer will rotate away from each other due to the antiferromagnetic coupling of the SAF structure but the spin torque resulting from current 304 will assure that the moment 260 moves in the desired direction for the final state, making moment 262 assume the opposite direction. The polarity of the spin torque current 304 determines if the element is written to the high or low resistance state.

Because the SAF free layer is driven near saturation or to saturation by $H_B$, any memory elements that experienced $H_B$ in the absence of the spin torque current 304 would be left in an uncontrolled state. Accordingly, the best method for applying this embodiment is for every bit experiencing the field $H_B$ to also receive a spin torque current 304. For example, a bitline over a number of bits corresponding to one word of data could be energized with current 302 and the state of each bit determined by the polarity of the spin torque current 304 that passes through each simultaneously.

Figure 11:
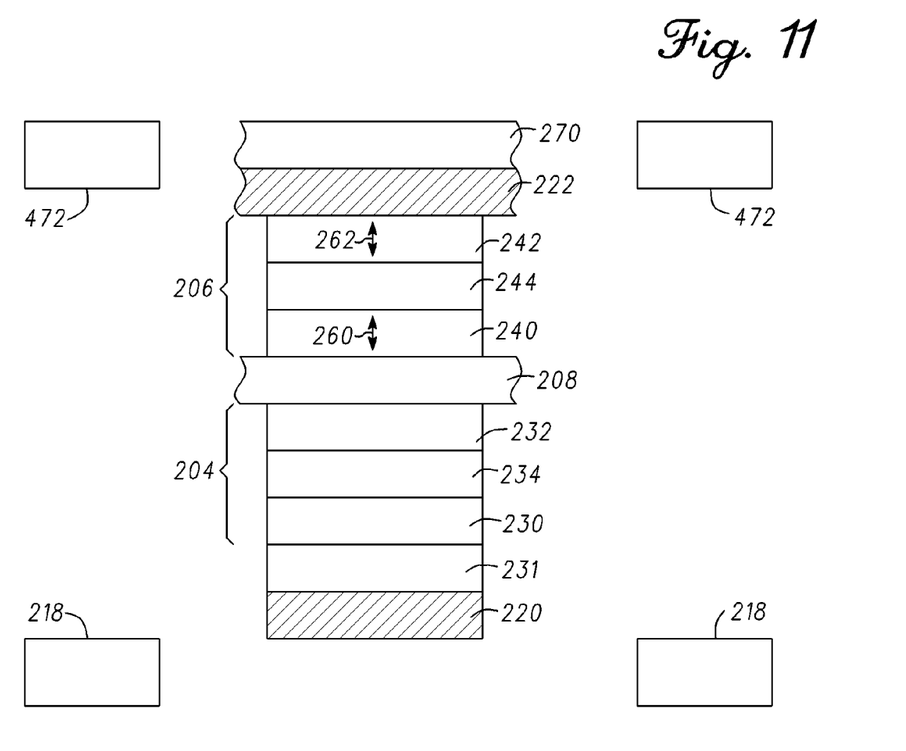
FIG. 11 is a cross-sectional view of a memory element in accordance with a third exemplary embodiment.

In a fourth embodiment shown in FIG. 11, magnetic materials with strong perpendicular anisotropy can be used to create a device with its easy axis perpendicular to the film plane rather than in the film plane as described in the previous embodiments. In this case, the current carrying line(s) 218, 472 can be located to the sides of the magnetoresistive memory element 202 so that they generate a magnetic field with a significant perpendicular component at the element.

Figure 12:
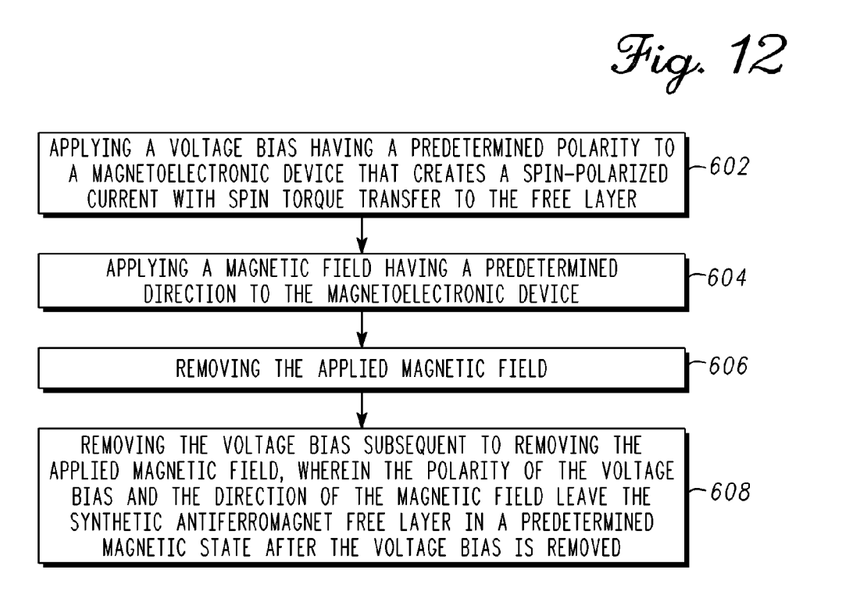
FIG. 12 is a flow chart of the steps of the exemplary embodiments.

In summary, a method for reducing spin-torque switching current density of a selected magnetoelectronic element (200, 300, 400) in an array of elements without causing unwanted reversal of other elements in the array includes the steps of providing elements with synthetic antiferromagnet free layer (206), applying (602) a voltage bias having a predetermined polarity to the magnetoelectronic device (200, 300, 400) that creates a spin-polarized current with spin torque transfer to the free layer (206), applying (604) a magnetic field having a predetermined direction to the magnetoelectronic device (200, 300, 400), removing (606) the applied magnetic field; and removing (608) the voltage bias subsequent to removing (606) the applied magnetic field, wherein the polarity of the voltage bias and the direction of the magnetic field leave the synthetic antiferromagnet free layer (206) in a predetermined magnetic state after the voltage bias is removed. The magnetic field may be applied along an easy axis with a magnitude less than the flop field, or it may be applied along a hard axis with a magnitude similar to or exceeding a saturation field of the synthetic antiferromagnet free layer (206) in the hard axis direction. In one exemplary embodiment, the magnetic field may be applied as a sequence of magnetic fields each having a distinct direction for toggle switching the synthetic antiferromagnet free layer (206), said magnetic fields being created by current pulses through two orthogonal conductors (218, 272, 372, 472) adjacent to the magnetoelectronic device (200, 300, 400). In another exemplary embodiment, the easy axis of the free layer is perpendicular to the film plane and the conductors are located laterally to produce a substantially perpendicular field at the device.

While at least four exemplary embodiments have been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for reducing spin-torque current density in a magnetoelectronic device, comprising:
    applying a voltage bias having a predetermined polarity to the magnetoelectronic device that creates a spin-polarized current with spin torque transfer to a synthetic antiferromagnet free layer;
    applying a magnetic field having a predetermined direction to the magnetoelectronic device;
    removing the applied magnetic field; and
    removing the voltage bias subsequent to removing the applied magnetic field;
    wherein the polarity of the voltage bias and the direction of the magnetic field leave the synthetic antiferromagnet free layer in a predetermined magnetic state after the voltage bias is removed.

2. The method of claim 1 wherein the applying a magnetic field comprises applying a sequence of magnetic fields each having a distinct direction for toggle switching the magnetic state of the synthetic antiferromagnet free layer.

3. The method of claim 1 wherein the synthetic antiferromagnet free layer has an easy axis and a flop field, and wherein the applying a magnetic field comprises applying along the easy axis with a magnitude less than the flop field.

4. The method of claim 1 wherein the synthetic antiferromagnet free layer has a saturation field and a hard axis having a direction, and wherein the applying a magnetic field comprises applying along the direction of the hard axis with a magnitude about the same as the saturation field in the hard axis direction.

5. The method of claim 1 wherein the synthetic antiferromagnet free layer has a saturation field and a hard axis having a direction, and wherein the applying a magnetic field comprises applying the magnetic field along the hard axis with a magnitude at least as large as the saturation field in the hard-axis direction.

6. The method of claim 1 further comprising at least one conductor adjacent to the magnetoelectronic device, wherein the applying a magnetic field comprises passing a current through the at least one conductor.

7. The method of claim 1 further comprising two orthogonal conductors adjacent to the magnetoelectronic device and wherein the applying a magnetic field comprises applying current pulses through the two conductors.

8. A method for reducing current density in a magnetoelectronic device comprising a tunnel barrier separating a synthetic antiferromagnetic free layer from a fixed layer, a first electrode contacting a side of the synthetic antiferromagnetic layer opposed to the tunnel barrier, a second electrode contacting a side of the fixed layer opposed to the tunnel barrier, and a first conductor disposed to provide a magnetic field to affect the free layer, comprising:
    applying a voltage bias having a predetermined polarity to the first and second electrodes that creates a spin-polarized current with spin torque transfer to the synthetic antiferromagnetic free layer;
    applying a first current to the first conductor to create the magnetic field having a predetermined direction;

removing the applied magnetic field; and
removing the voltage bias subsequent to removing the applied magnetic field;
wherein the polarity of the voltage bias and the direction of the magnetic field leave the synthetic antiferromagnet free layer in a predetermined magnetic state after the voltage bias is removed.

9. The method of claim 8 further comprising a second conductor disposed to provide a magnetic field to affect the fixed layer and further comprising applying a second current to the second conductor to create the magnetic field.

10. The method of claim 8 wherein the applying a first current comprises applying current pulses to create a sequence of magnetic fields each having a distinct direction for toggle switching the magnetic state of the synthetic antiferromagnet free layer.

11. The method of claim 8 wherein the synthetic antiferromagnet free layer has an easy axis and a flop field, and wherein the applying a magnetic field comprises applying the magnetic field along the easy axis with a magnitude less than the flop field.

12. The method of claim 8 wherein the synthetic antiferromagnet free layer has a saturation field and a hard axis having a direction, and wherein the applying a magnetic field comprises applying along the direction of the hard axis with a magnitude exceeding the saturation field in the hard axis direction.

13. The method of claim 8 wherein the synthetic antiferromagnet free layer has a saturation field and a hard axis having a direction, and wherein the applying a magnetic field comprises applying the magnetic field along the hard axis with a magnitude at least as large as the saturation field in the hard-axis direction.

* * * * *